United States Patent
Ten Kate et al.

(10) Patent No.: US 7,656,501 B2
(45) Date of Patent: Feb. 2, 2010

(54) LITHOGRAPHIC APPARATUS

(75) Inventors: Nicolaas Ten Kate, Almkerk (NL); Nicolaas Rudolf Kemper, Eindhoven (NL); Martinus Hendrikus Antonius Leenders, Rotterdam (NL); Joost Jeroen Ottens, Veldhoven (NL); Johannes Petrus Maria Smeulers, Zwijndrecht (NL)

(73) Assignee: ASML Netherlands B.V., Veldhoven (NL)

(*) Notice: Subject to any disclaimer, the term of this patent is extended or adjusted under 35 U.S.C. 154(b) by 458 days.

(21) Appl. No.: 11/274,888

(22) Filed: Nov. 16, 2005

(65) Prior Publication Data

US 2007/0109512 A1    May 17, 2007

(51) Int. Cl.
  *G03B 27/42*    (2006.01)
(52) U.S. Cl. .......................... 355/53; 355/72
(58) Field of Classification Search .......... 355/30, 355/53, 72
  See application file for complete search history.

(56) References Cited

U.S. PATENT DOCUMENTS

| | | | |
|---|---|---|---|
| 3,573,975 A | 4/1971 | Dhaka et al. ............... 117/212 |
| 3,648,587 A | 3/1972 | Stevens ......................... 95/44 |
| 4,346,164 A | 8/1982 | Tabarelli et al. ............. 430/311 |
| 4,390,273 A | 6/1983 | Loebach et al. .............. 355/125 |
| 4,396,705 A | 8/1983 | Akeyama et al. ............ 430/326 |
| 4,480,910 A | 11/1984 | Takanashi et al. ............. 355/30 |
| 4,509,852 A | 4/1985 | Tabarelli et al. |
| 5,040,020 A | 8/1991 | Rauschenbach et al. ....... 355/53 |
| 5,121,256 A | 6/1992 | Corle et al. .................. 359/664 |
| 5,610,683 A | 3/1997 | Takahashi .................... 355/53 |
| 5,825,043 A | 10/1998 | Suwa ......................... 250/548 |
| 5,900,354 A | 5/1999 | Batchelder .................. 430/395 |
| 6,191,429 B1 | 2/2001 | Suwa et al. |
| 6,236,634 B1 | 5/2001 | Lee et al. ..................... 369/112 |
| 6,600,547 B2 | 7/2003 | Watson et al. ................. 355/30 |
| 6,603,130 B1 | 8/2003 | Bisschops et al. ......... 250/492.1 |
| 6,809,794 B1 | 10/2004 | Sewell ......................... 355/30 |
| 2002/0020821 A1 | 2/2002 | Van Santen et al. ......... 250/492 |
| 2002/0163629 A1 | 11/2002 | Switkes et al. ................ 355/53 |
| 2003/0123040 A1 | 7/2003 | Almogy ........................ 355/69 |
| 2004/0000627 A1 | 1/2004 | Schuster .................. 250/201.2 |

(Continued)

FOREIGN PATENT DOCUMENTS

| | | |
|---|---|---|
| DE | 206 607 | 2/1984 |
| DE | 221 563 | 4/1985 |
| DE | 224 448 | 7/1985 |
| DE | 242 880 | 2/1987 |
| EP | 0023231 | 2/1981 |

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Peter B Kim
*Assistant Examiner*—Steven H Whitesell-Gordon
(74) *Attorney, Agent, or Firm*—Pillsbury Winthrop Shaw Pittman LLP

(57) ABSTRACT

A barrier member is provided for use in immersion lithography. The barrier member includes an extractor assembly on a bottom surface which faces the substrate. The extractor assembly includes a plate which splits the space between a liquid removal device and the substrate in two such that a meniscus is formed in an upper channel between the liquid removal device and the plate and a meniscus is formed in a lower channel between the plate and the substrate.

31 Claims, 5 Drawing Sheets

U.S. PATENT DOCUMENTS

| | | |
|---|---|---|
| 2004/0075895 A1 | 4/2004 | Lin .................................. 359/380 |
| 2004/0114117 A1 | 6/2004 | Bleeker ........................ 355/53 |
| 2004/0136494 A1 | 7/2004 | Lof et al. |
| 2004/0160582 A1 | 8/2004 | Lof et al. ........................ 355/30 |
| 2004/0165159 A1 | 8/2004 | Lof et al. ........................ 355/30 |
| 2004/0207824 A1 | 10/2004 | Lof et al. |
| 2004/0211920 A1 | 10/2004 | Derksen et al. ........... 250/492.1 |
| 2004/0239954 A1 | 12/2004 | Bischoff ...................... 356/635 |
| 2004/0263809 A1 | 12/2004 | Nakano ........................ 355/30 |
| 2005/0007569 A1 | 1/2005 | Streefkerk et al. ............. 355/30 |
| 2005/0018155 A1 | 1/2005 | Cox et al. ...................... 355/30 |
| 2005/0024609 A1 | 2/2005 | De Smit et al. ................ 355/18 |
| 2005/0030497 A1 | 2/2005 | Nakamura .................... 355/30 |
| 2005/0046813 A1 | 3/2005 | Streefkerk et al. ............. 355/30 |
| 2005/0046934 A1 | 3/2005 | Ho et al. ...................... 359/380 |
| 2005/0052632 A1 | 3/2005 | Miyajima ..................... 355/53 |
| 2005/0094116 A1 | 5/2005 | Flagello et al. ................ 355/53 |
| 2005/0094125 A1 | 5/2005 | Arai ............................. 355/72 |
| 2005/0122505 A1 | 6/2005 | Miyajima ..................... 355/72 |
| 2005/0132914 A1 | 6/2005 | Mulkens et al. ........... 101/463.1 |
| 2005/0134817 A1 | 6/2005 | Nakamura .................... 355/53 |
| 2005/0140948 A1 | 6/2005 | Tokita .......................... 355/30 |
| 2005/0146693 A1 | 7/2005 | Ohsaki ......................... 355/30 |
| 2005/0146694 A1 | 7/2005 | Tokita .......................... 355/30 |
| 2005/0151942 A1 | 7/2005 | Kawashima ................. 355/30 |
| 2005/0200815 A1 | 9/2005 | Akamatsu ..................... 353/53 |
| 2005/0213065 A1 | 9/2005 | Kitaoka ........................ 355/53 |
| 2005/0213066 A1 | 9/2005 | Sumiyoshi ................... 355/53 |
| 2005/0219489 A1 | 10/2005 | Nei et al. ....................... 355/53 |
| 2005/0233081 A1 | 10/2005 | Tokita ........................ 427/256 |
| 2006/0290909 A1 | 12/2006 | Donders et al. ............... 355/53 |

FOREIGN PATENT DOCUMENTS

| | | |
|---|---|---|
| EP | 0418427 | 3/1991 |
| EP | 1039511 | 9/2000 |
| EP | 1 420 300 A2 | 5/2004 |
| EP | 1 489 462 A2 | 12/2004 |
| EP | 1 420 300 A3 | 8/2005 |
| EP | 1 489 462 A3 | 6/2006 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | 99/49504 | 9/1999 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometeric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003 .

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, J. Microlith., Microfab., Microsyst. 1(1):7-12 (2002).

International Search Report issued for International Patent Application No. PCT/GB2006/004275, dated Apr. 4, 2007.

LITHOGRAPHIC APPARATUS

1. FIELD

The present invention relates to a lithographic apparatus.

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852 means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another solution which has been proposed is to provide the liquid supply system with a barrier member which extends along at least a part of a boundary of the space between the final element of the projection system and the substrate table. The barrier member is substantially stationary relative to the projection system in the XY plane though there may be some relative movement in the Z direction (in the direction of the optical axis). A seal is formed between the barrier member and the surface of the substrate. In an embodiment, the seal is a contactless seal such as a gas seal. Such a system with a gas seal is depicted in FIG. 5 and disclosed in U.S. patent application publication no. US 2004-0207824, hereby incorporated in its entirety by reference.

In European patent application publication no. EP 1420300 and United States patent application publication no. US 2004-0136494, each hereby incorporated in their entirety by reference the idea of a twin or dual stage immersion lithography apparatus is disclosed. Such an apparatus is provided with two tables for supporting the substrate. Leveling measurements are carried out with a table at a first position, without immersion liquid, and exposure is carried out with a table at a second position, where immersion liquid is present. Alternatively, the apparatus may have only one table movable between exposure and measurement positions.

3. SUMMARY

It would be desirable, for example, to provide a liquid supply system in which the chance of gas being included in and/or liquid loss from a liquid reservoir positioned between the substrate and the projection system is reduced.

According to an aspect of the invention, there is provided a lithographic apparatus, comprising:
  a barrier member surrounding a space between a final element of a projection system and a substrate to at least partly constrain liquid in the space, the barrier member comprising:
  an extractor configured to remove liquid from between the barrier member and the substrate; and
  a plate member located between the extractor and the substrate such that a first radially extending channel, open to the space, is formed between the extractor and the plate member and a second radially extending channel, open to the space, is formed between the plate member and the substrate.

According to an aspect of the invention, there is provided a lithographic apparatus, comprising a liquid supply system configured to provide a liquid in a space between a final element of the projection system and a substrate, the liquid supply system including a seal apparatus configured to form a seal between the liquid supply system and the substrate, the seal apparatus including a divider to divide a gap between the liquid supply system and the substrate horizontally into two such that, in use, the liquid forms two meniscuses, one above the divider and one below the divider.

According to an aspect of the invention, there is provided a lithographic apparatus, comprising:
- a liquid supply system including a barrier member which surrounds a space between a final element of a projection system and a substrate;
- a liquid removal device configured to remove liquid and which surrounds the space and has an inlet which extends in the radial direction, the removal capacity of the liquid removal device being dependent on an amount of the inlet being covered by liquid; and
- a radially inwardly extending projection positioned between the inlet and the substrate to split the area between the inlet and the substrate in two.

According to an aspect of the invention, there is provided a lithographic apparatus, comprising a barrier member surrounding a space between a final element of a projection system and a substrate to at least partly constrain liquid in the space, the barrier member comprising a moveable surface and configured so that, in use, a meniscus of liquid in the space extends between the surface and the substrate, and a controller adapted to control the movement of the moveable surface in the substantially same direction relative to the projection system as the substrate is moved and at a speed equal to two times the speed of the substrate or less during at least a portion of movement of the substrate.

According to another aspect, there is provided a lithographic apparatus, comprising a barrier member which surrounds a space between a final element of a projection system and a substrate and configured to at least partly constrain liquid in the space, the barrier member comprising a plate member moveable in a plane substantially parallel to a top surface of the substrate and biased towards a neutral position and configured such that, in use, a meniscus of the liquid in the space extends between the plate member and the substrate.

According to another aspect, there is provided a device manufacturing method, comprising constraining a liquid in a space between a final element of a projection system and a substrate using a barrier member, moving the substrate relative to the projection system, moving a surface of the barrier member in the same direction and at a speed equal to two times the speed of the substrate or less such that a meniscus of liquid between the surface and the substrate has forces on it reduced from what they would have been without movement of the surface during at least a portion of movement of the substrate, and transferring a pattern from a patterning device onto a substrate.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

5. DETAILED DESCRIPTION

Figure 1:
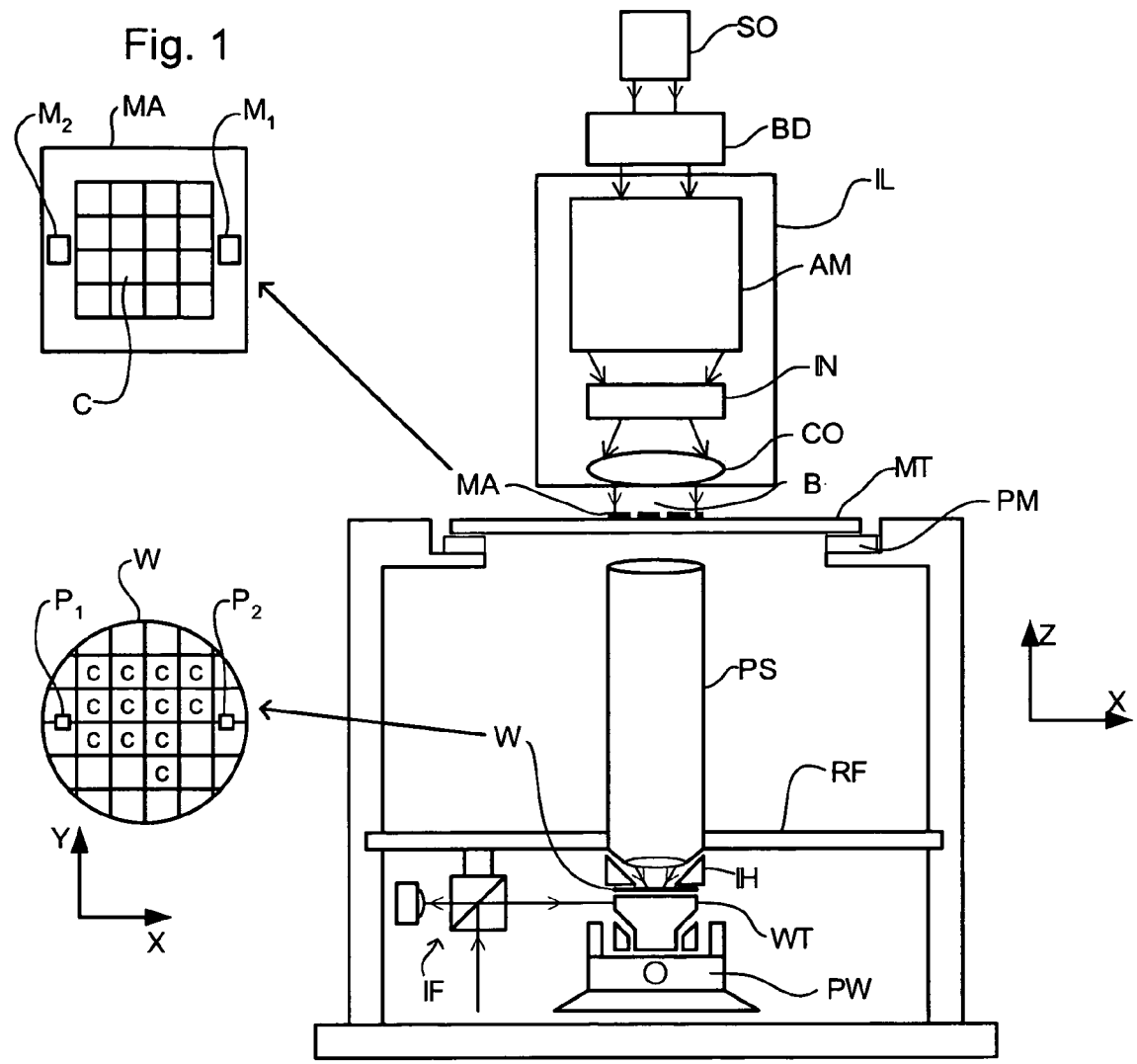
FIG. 1 depicts a lithographic apparatus according to an embodiment of the invention.
Figure 2:
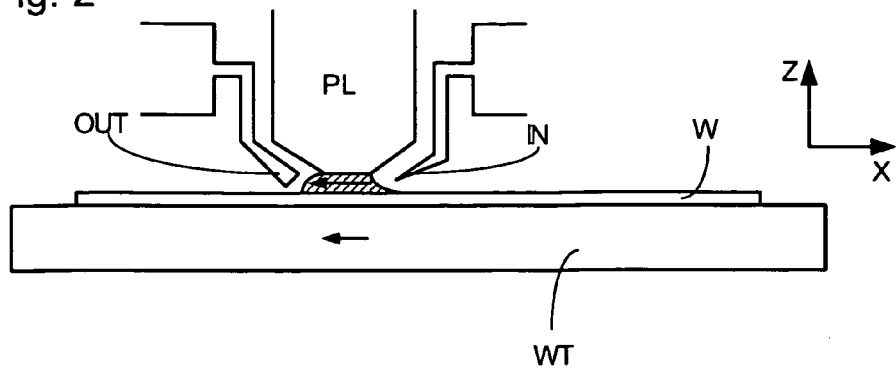
FIGS. 2 and 3 depict a liquid supply system for use in a lithographic projection apparatus.
Figure 3:
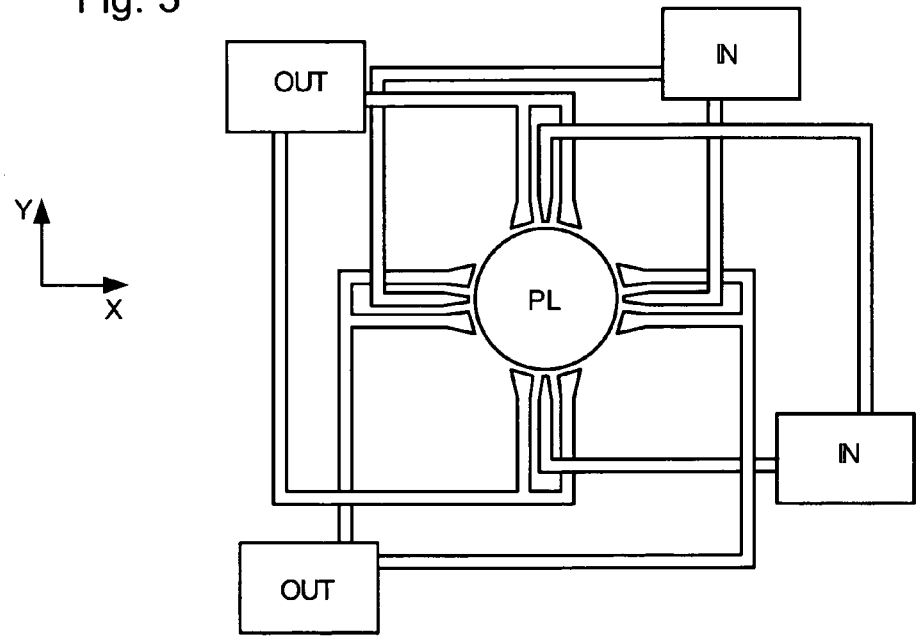
Figure 4:
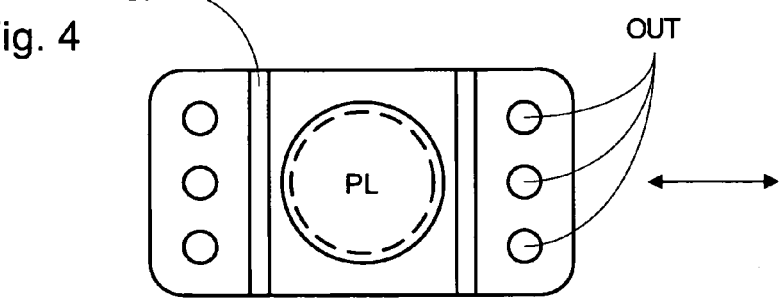
FIG. 4 depicts another liquid supply system for use in a lithographic projection apparatus.
Figure 4:
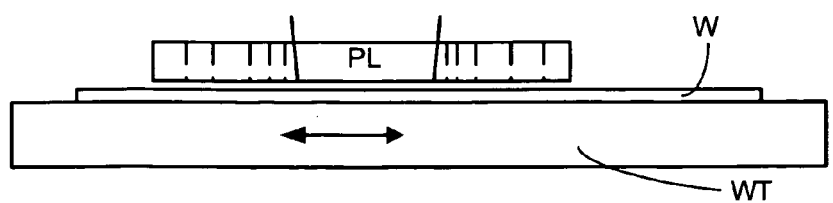
Figure 5:
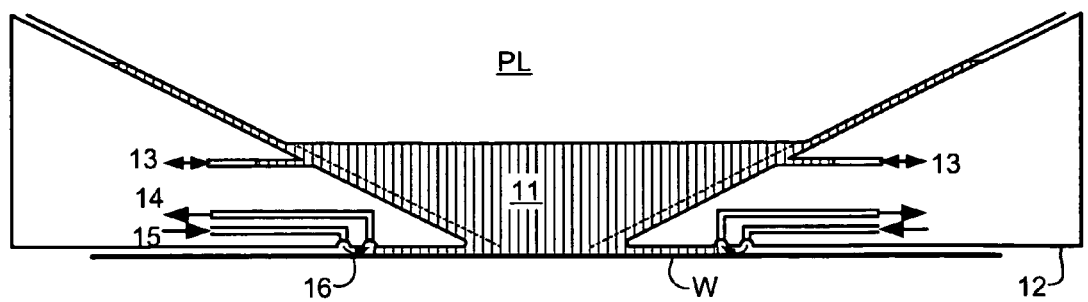
FIG. 5 illustrates, in cross-section, a barrier member or liquid confinement structure configured to form a gas seal between the liquid supply system and the substrate.

FIG. 1 schematically depicts a lithographic apparatus according to one embodiment of the invention. The apparatus comprises:
- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 6:
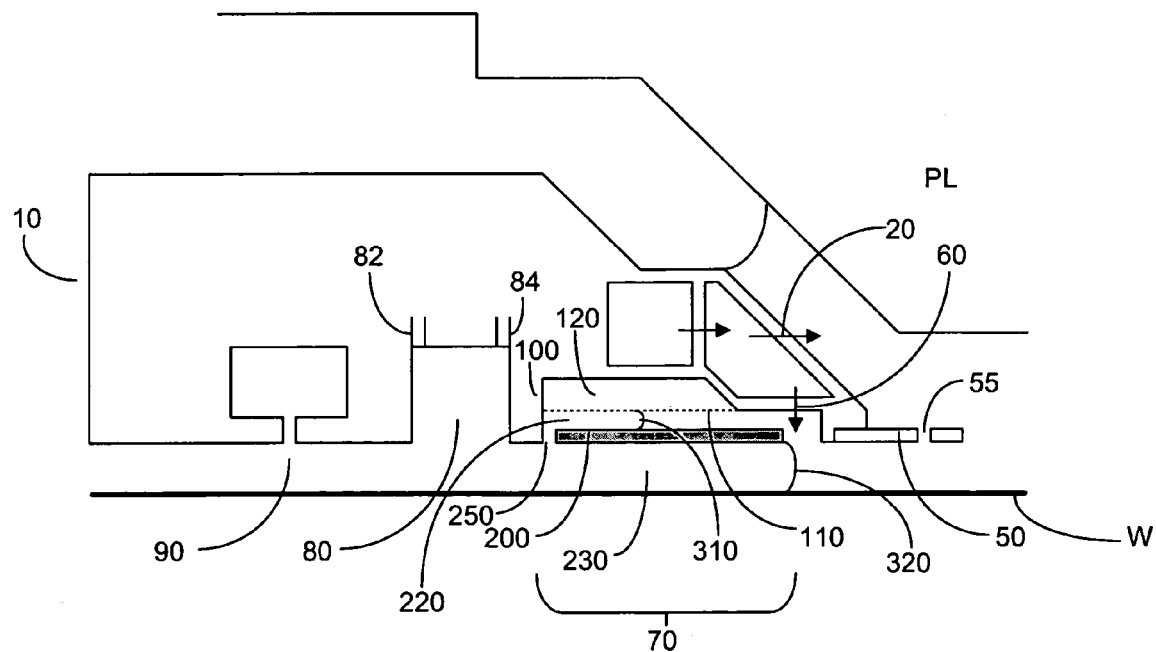
FIG. 6 illustrates, in cross-section, a first embodiment of the present invention.

FIG. 6 illustrates a barrier member 10 which is part of a liquid supply system. The barrier member 10 extends around the periphery of the final element of the projection system PL such that the barrier member is, for example, substantially annular in overall shape. The projection system PL may not be circular and the outer or inner edge of the barrier member 10 may not be circular so that it is not necessary for the barrier member to be ring shaped and it could also be other shapes so long as it has a central portion through which the projection beam may pass out of the final element of the projection system PL through liquid contained between the barrier member 10 and the substrate W and onto the substrate W. The barrier member is described as being circular (for example, this is an easy shape to manufacture) and references to radially (i.e. in and out towards the optical axis) are made. However, the term should be construed more generally to encompass movements with other geometries generally away from and towards the optical axis but in other geometries the directions may not exactly pass through the optical axis.

The function of the barrier member 10 is to maintain or confine liquid in the space between the projection system PL and the substrate W so that the projection beam may pass through the liquid. The top level of liquid is simply contained by the presence of the barrier member and the level of liquid in the space is maintained such that the liquid does not overflow over the top of the barrier member 10. In an embodiment, seal apparatus is provided to form a seal between the bottom of the barrier member 10 and the substrate W, which in FIG. 6 is a contactless seal and the seal apparatus is made up of several components. Working radially outwardly from the optical axis of the projection system PL, there is provided a flow plate 50 which extends into the space (though not into the path of the projection beam) which helps maintain substantially parallel flow of the immersion liquid out of outlet 20 across the space. In an embodiment, the flow plate 50 has one or more through holes 55 in it to reduce the resistance to movement in the direction of the optical axis of the barrier member 10 relative to the projection system PL and/or substrate W. Moving radially outwardly along the bottom of the barrier member 10 there is then provided an outlet 60 which provides a flow of liquid in a direction substantially parallel to the optical axis towards the substrate. This flow of liquid is used to help fill any gaps between the edge of the substrate W and the substrate table WT which supports the substrate. If this gap is not filled with liquid, bubbles may be included in the liquid in the space between the projection system PL and the substrate W when an edge of the substrate W is being crossed by the seal. This is undesirable as it may lead to deterioration of the image quality.

Radially outwardly of the outlet 60 is a extractor assembly 70 to extract liquid from between the barrier member 10 and the substrate W. The extractor 70 will be described in more detail below and forms part of the apparatus used to created the contactless seal between the barrier member 10 and the substrate W.

Radially outwardly of the extractor assembly is a recess 80 which is connected through an inlet 82 to the atmosphere and via an outlet 84 to a low pressure source. Radially outwardly of the recess 80 is a gas knife 90. An arrangement of the extractor, recess and gas knife is disclosed in detail in U.S. patent application No. U.S. 60/643,626, filed 14 Jan. 2005, which is incorporated herein its entirety by reference. However, in that patent application the arrangement of the extractor assembly is different.

The extractor assembly 70 comprises a liquid removal device or extractor or inlet 100 such as the one disclosed in U.S. patent application No. U.S. Ser. No. 10/921,348, filed 19 Aug. 2004, which is incorporated herein its entirety by reference. Any type of liquid extractor can be used. In an embodiment, the liquid removal device 100 comprises an inlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material prevent ambient gas (e.g., air) being drawn into the chamber 120 of the liquid removal device 100. However, when the porous surface 110 comes into contact with liquid there is no meniscus to restrict flow and the liquid can flow freely into the chamber 120 of the liquid removal device 100. The porous surface 110 extends radially inwardly along the barrier member 10 (as well as around the space) and its rate of extraction varies according to how much of the porous material 110 is covered by liquid.

Control of the meniscus of liquid between the barrier member 10 and the substrate W is significant. During scanning of the substrate W (during which the substrate moves under the barrier member 10 and projection system PL) the meniscus can be drawn either towards or away from the optical axis by a drag force applied by the moving substrate. This may lead to liquid loss which may result in evaporation of the liquid and thereby cooling of the substrate and consequent shrinkage and possible overlay errors. Liquid stains may also be left behind from interaction between the liquid droplets and resist photochemistry. Another or alternative potential problem is the inclusion of gas into the space between the projection system PL and the substrate W which can lead to bubbles and deterioration in the quality of the projected image when the meniscus is dragged into the space. In one or more embodiments of the invention, a plate 200 is provided between the liquid removal device 100 and the substrate W so that the function of liquid extraction and the function of meniscus control can be separated from one another and the barrier member 10 may be optimized for each.

Viscous drag length, the distance between the start of the space and the meniscus between the barrier member 10 and the substrate W, may have a large influence on the maximum scan speed which is possible without that meniscus collapsing. The length should be long enough for the liquid in the gap to be able to change flow direction. On the one hand the accumulation of viscous drag forces may be reduced or minimized by keeping the distance between the meniscus and the inner edge of the barrier member 10 low and the height of the gap between the bottom of the barrier member and the substrate as large as possible. Partly because of space constraints it may not be possible to arrange for the extractor assembly 70 to be any closer to the edge of the space. However, an optimum gap height may be determined by a balance between viscous friction (smaller gap=bigger velocity gradient=bigger viscous friction), dynamic pressure (bigger gap=bigger amount of liquid to turn) and capillary pressure (bigger gap=smaller capillary pressure to withstand the load). In order to deal with these factors, the plate 200 is positioned between the liquid removal device 100 and the substrate W. The plate 200 may be, for example, in the form of a projection which projects radially inwardly from a vertical surface of the barrier member 10 which is radially outwardly of the extractor assembly 70. The projection or plate 200 is a divider or any other element which has the function of splitting the space between the liquid removal device 100 and the substrate W into two channels, an upper channel 220 and a lower channel 230 wherein the upper channel 220 is between the upper surface of the projection 200 and the liquid removal device 100 and the lower channel 230 is between the lower surface of the projection 200 and the substrate W. Each channel is open, at its radially innermost end, to the space. The thickness of the plate is not critical.

In an embodiment, the upper channel 220 between the liquid removal device 100 and the plate 200 is narrower than the lower channel 230 between the plate 200 and the substrate W. The lower channel may be between 250 mm and 50 μm high, or between 100 and 60 μm depending on design (viscous drag length from flow pattern), fluid parameters (viscosity, density, surface tension) and surface properties (contact angle resulting from binding energy surface/liquid and liquid surface tension). The upper channel has a stronger capillary action, for instance by making it 2 to 3 times narrower than the lower channel. Alternatively or additionally, the upper channel may be made with a surface which is more liquid phillic than the lower channel.

In this way there are two meniscuses 310, 320. A first meniscus 310 is positioned above the plate 200 and extends between the porous surface 110 and the top surface of the plate 200 and a second meniscus 320 is positioned underneath the plate 200 and extends between the plate 200 and the substrate W. In this way the extractor assembly 70 may be optimized for control of the first meniscus for optimum extraction of liquid and for positional control of the second meniscus 320 such that the viscous drag length for the second meniscus is reduced and the characteristics, in particular of the plate 200 are configured to make it energetically favorable for the meniscus 320 to remain adhered to the plate 200 such that the scan speed of the substrate W beneath the barrier member 10 may be increased. Capillary forces acting on the second meniscus 320 are outwards and are balanced by an under pressure in the liquid adjacent the meniscus so that the meniscus stays substantially still. Higher loading on the meniscus, for example by viscous drag and inertia, may be accommodated by a lowering of the contact angle of the meniscus with the surface.

In FIG. 6 the basic extractor assembly 70 is illustrated. One or more breathing holes 250 are provided at the radially outward most end of the plate 200 such that the first meniscus 310 is free to move inwardly and outwardly beneath the porous material 110 so that the extraction rate of the liquid removal device 100 can vary according to how much of the porous material 110 is covered by liquid. As illustrated in FIG. 6 the second meniscus 320 is adhered to a lower inner edge of the plate 200.

In FIG. 6 the inner most bottom edge of the plate 200 is provided with a sharpe edge so as to substantially pin the second meniscus 320 in place. In an embodiment, the radius of the edge is less than 0.1 mm, less than 50 µm, less than 20 µm or about 10 µm.

An alternative way of pinning the second meniscus 320 is to change the surface properties of the surface of the plate 200 to which the second meniscus 320 adheres. For example, a change from a liquidphilic to a liquidphobic surface in a radially outward direction on the plate 200 could also result in pinning of the meniscus 320 at that change because the shape of the meniscus will need to invert for it to pass from the liquidphilic to the liquidphobic surface. Another alternative is to change the surface of the plate 200 from a rough to a smooth surface. When fully wetted the rough surface can act as a meniscus trap. If the surface is not fully wetted and the liquid is only on the peaks of the roughness, a rough surface can act liquidphobic such as in the so called lotus effect. Alternatively, electro wetting could be used to locally trap the meniscus, which has an advantage in that it can be turned on and off. Any combination of the pinning schemes described herein may be used.

Figure 7:
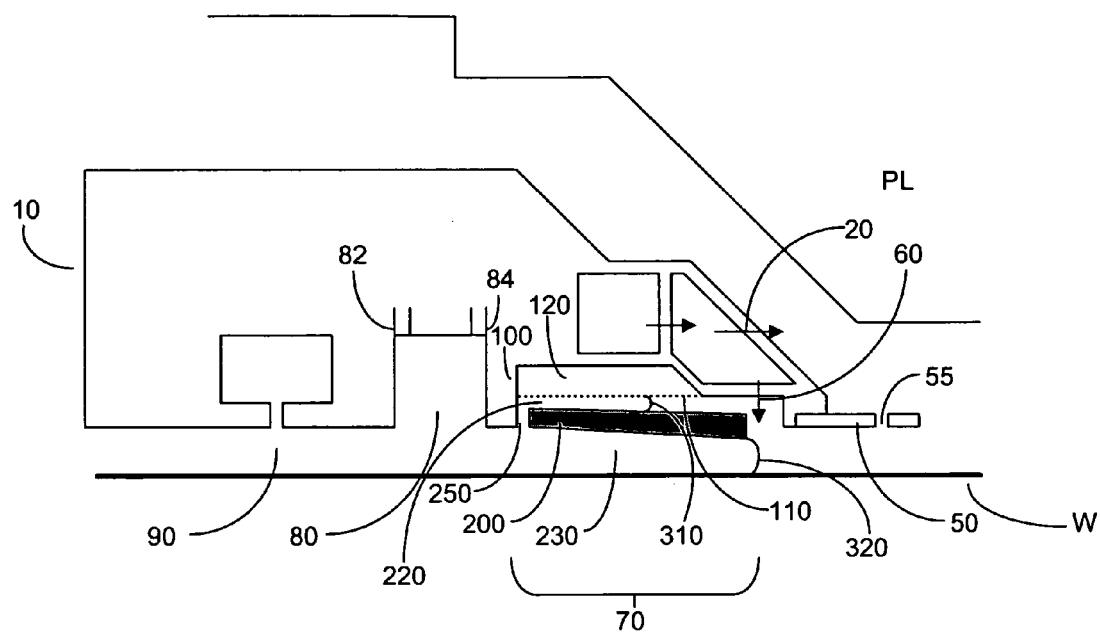
FIG. 7 illustrates, in cross-section, a second embodiment of the present invention.
Figure 8:
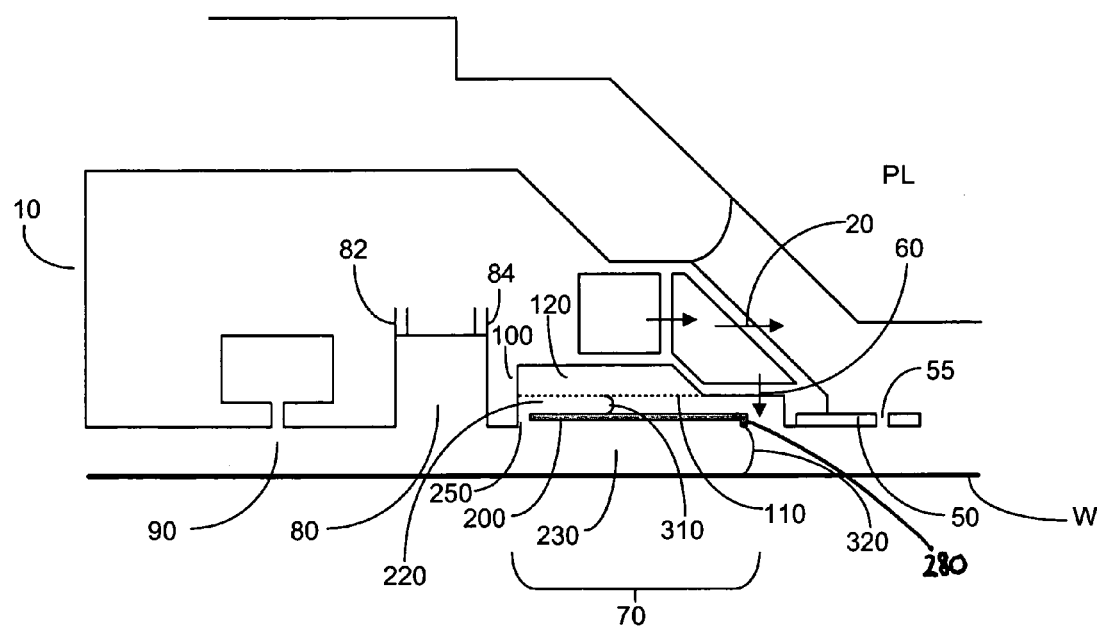
FIG. 8 depicts, in cross-section, a third embodiment of the present invention.

There are two further embodiments illustrated in FIGS. 7 and 8 which are useful for use in preventing the meniscus 320 from moving outwards. In FIG. 7 the bottom surface of the plate 200 is angled such that its distance from the substrate W increases in an outward direction (away from the optical axis). Thus, the length of the second meniscus 320 will need to increase for the meniscus to move outwardly and this is energetically unfavorable. Conversely, the plate 200 has a top surface which is angled relative to the liquid removal device 100 such that the distance between the top surface of the plate 200 and the liquid removal device 100 decreases further away from the optical axis. This encourages the first meniscus 310 to move outwardly such that the extraction capacity of the liquid removal device is increased.

A further way of substantially pinning the second meniscus 320 in place is to provide a step change in the distance between the bottom surface of the plate 200 and the substrate W such that in order to move past the step 280 the length of the second meniscus 320 will have to increase significantly. Such an increase in length of the second meniscus 320 requires energy and is thus useful in pinning the position of the second meniscus 320.

Figure 9:
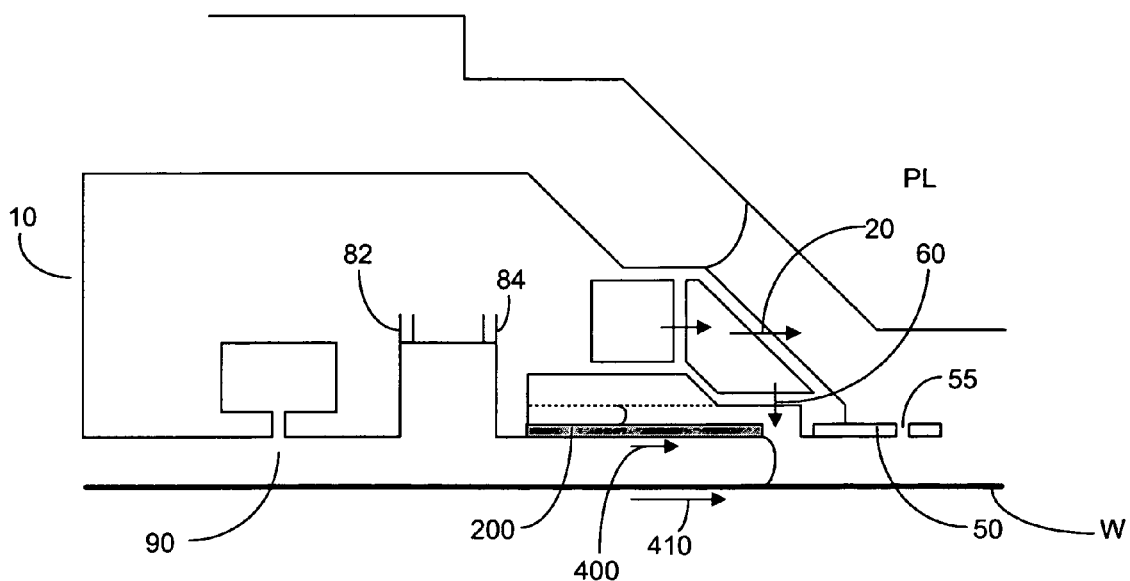
FIG. 9 depicts, in cross-section, a fourth embodiment of the present invention.

FIG. 9 illustrates a fourth embodiment which is the same as the first embodiment except as described below. Any of the features previously mentioned may also be present in the fourth embodiment.

In the fourth embodiment the plate 200 is translatable in a plane substantially parallel to the substrate W. When the substrate moves to the right hand side as illustrated by arrow 410, the plate 200 is also moved to the right hand side as indicated by arrow 400 at a speed equal to two times the speed of the substrate W or less. This is represented by the different sizes of arrows in FIG. 9. Of course both these movements are relative to the projection system PL and barrier member 10. In this relative speed range the speed difference between the substrate W and the plate 200 is reduced. For example if the plate is moved at half the velocity of the substrate W this means that the maximum scan speed at which the lower meniscus 320 breaks is increased by a factor of 2 because the relative speed of the substrate to the plate is reduced by half. The upper meniscus only experiences the plate movement. It may be necessary to provide a breathing hole equivalent to breathing hole 250 in the side wall of the barrier member rather than through the plate 200. Lower speeds of the plate, say up to a speed equal to the speed of the substrate, provide the same benefits as higher speeds up to twice the speed of the substrate but are easier to implement.

In practice the plate may move at any speed which reduces the relative velocity of the bottom surface of the plate 200 relative to the substrate W. During scanning in order to prevent cumulative movement in a certain direction the plate is only moved during the fast movements of the substrate W and can then be brought back gradually to a centered position during slower movement or during periods where there is no movement. Thus, during Y scans the plate may simply move up and down during the meandering and during X steps the plate may move with the substrate W. During the Y scans the plate may move back to its original position to prevent accumulative movement in the X direction. In an embodiment, the plate is moved in a direction in which the substrate is substantially stationary during a portion of time in which the substrate is substantially stationary in the direction.

The movement of the plate may be either active or passive. In the case of an active plate, a control system is provided which interacts with data from the overall controller of the lithographic apparatus to co-ordinate movements of the plate 200 with movements of the substrate W. The plate 200 may be actuated by, for example a piezo electric actuator, a linear motor, etc. In an embodiment in which the plate is moved passively, the plate may be attached to the barrier member 10 by springs positioning it in the X-Y direction. Friction between the moveable plate 200 and the substrate W will provide enough force for the plate to be moved in the same direction as the substrate W. By adding a liquidphobic coating at an edge of the plate 200, the force exerted on the plate by the substrate W through the liquid is increased. The strength of the springs is chosen such that the plate moves only during step movements of high speed.

Although the fourth embodiment is described in relation to the case where a meniscus is present above and below the plate, and in particular in conjunction with the first to third embodiments, this is not necessarily the case and this principle may be used for other applications particularly in the immersion lithography field. In an embodiment, the plate 200 is dispensed with and the bottom surface of the barrier member 10 is used in the same way as the plate as described above. If a larger central region is provided in the barrier member 10 through which the projection beam PB can be projected onto the substrate W, the barrier member 10 may itself be moved in the same direction as the substrate W in order to reduce the relative velocity of the substrate W relative to the bottom surface of the barrier member 10.

In one or more embodiments, the controller may also predict likely movements required by the bottom surface of the plate 200 and/or the barrier member 10 in the future because it has the data regarding the movement which the substrate will undergo during exposure so that it may, during slow movement of the substrate relative to the projection system, move the moveable member close to an extreme position (or back to a central position) so as to maximize the available movement of the member for a future high speed movement of the substrate relative to the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a barrier member surrounding a space between a final element of a projection system and a substrate to at least partly constrain liquid in the space, the barrier member comprising:
   an extractor configured to remove liquid from between the barrier member and the substrate; and
   a plate member located between the extractor and the substrate such that a first radially extending channel, open to the space, is formed between the extractor and the plate member and a second radially extending channel, open to the space, is formed between the plate member and the substrate, wherein, in use, liquid flows into the first channel to form a meniscus extending from the extractor in the channel.

2. The lithographic apparatus of claim 1, wherein the first channel is narrower than the second channel.

3. The lithographic apparatus of claim 1, wherein the first channel narrows in a radially outward direction.

4. The lithographic apparatus of claim 1, wherein the second channel widens in a radially outward direction.

5. The lithographic apparatus of claim 1, wherein the plate member has a meniscus pinning feature to make it energetically unfavorable for a meniscus attached to the feature to move radially outwardly of the feature.

6. The lithographic apparatus of claim 1, wherein the bottom surface of the plate member has a step formed in it such that the second channel is wider radially outward of the step.

7. The lithographic apparatus of claim 1, wherein the plate member has a radially inner most bottom edge which has a radius of less than 0.1 mm.

8. The lithographic apparatus of claim 1, wherein the plate member has a change in surface property on an underside from liquidphobic to liquidphilic in a direction radially outwardly.

9. The lithographic apparatus of claim 1, wherein the plate member has a change in surface roughness from relatively rough to relatively smooth on an underside in a direction radially outwardly.

10. The lithographic apparatus of claim 1, wherein the extractor further comprises a porous material through which liquid is removed.

11. The lithographic apparatus of claim 10, wherein the porous material extends in a radial direction and an extraction capacity of the extractor increases with increasing area of the porous material covered by liquid.

12. The lithographic apparatus of claim 1, wherein the plate member is moveable in a plane substantially parallel to a top surface of the substrate.

13. The lithographic apparatus of claim 12, further comprising a controller adapted to control the movement of the plate member in the substantially same direction relative to the projection system as the substrate is moved and at a speed equal to two times the speed of the substrate or less during at least a portion of movement of the substrate.

14. The lithographic apparatus of claim 1, wherein the plate member is constructed and arranged to make it energetically favorable for a meniscus below the plate member to be positioned attached to a radially inner most edge of the plate member.

15. A lithographic apparatus, comprising:
a liquid supply system including a barrier member which surrounds a space between a final element of a projection system and a substrate;
a liquid removal device configured to remove liquid and which surrounds the space and has an inlet which extends in the radial direction, the removal capacity of the liquid removal device being dependent on an amount of the inlet being covered by liquid; and
a radially inwardly extending projection positioned between the inlet and the substrate to split the area between the inlet and the substrate in two, wherein, in use, a meniscus extends from the inlet in the area between the inlet and the projection.

16. The lithographic apparatus of claim 12, wherein the moveable plate member is moveable relative to the barrier member.

17. The lithographic apparatus of claim 13, wherein the controller is further adapted to move the moveable plate member in the substantially same direction as the substrate during a highest speed movement of the substrate.

18. The lithographic apparatus of claim 13, wherein the controller is further adapted to move the moveable plate member in a direction against the movement of the substrate during at least a portion of a low speed movement of the substrate in the direction or to move the moveable plate member in a direction in which the substrate is substantially stationary during a portion of time in which the substrate is substantially stationary in the direction.

19. The lithographic apparatus of claim 1, wherein the plate member is moveable in a plane substantially parallel to a top surface of the substrate and biased towards a neutral position and the barrier member is configured such that, in use, a meniscus of the liquid in the space extends between the plate member and the substrate.

20. The lithographic apparatus of claim 19, wherein the biasing is such that forces transmitted through the liquid from the substrate to the plate member are high enough during high speed movement of the substrate to move the plate member relative to the barrier member.

21. The lithographic apparatus of claim 15, wherein the area between the inlet and the projection is narrower than the area between the projection and the substrate.

22. The lithographic apparatus of claim 15, wherein the area between the inlet and the projection narrows in a radially outward direction.

23. The lithographic apparatus of claim 15, wherein the area between the projection and the substrate widens in a radially outward direction.

24. The lithographic apparatus of claim 15, wherein the projection has a meniscus pinning feature to make it energetically unfavorable for a meniscus attached to the feature to move radially outwardly of the feature.

25. The lithographic apparatus of claim 15, wherein the bottom surface of the projection has a step formed in it such that the area between the projection and the substrate is wider radially outward of the step.

26. The lithographic apparatus of claim 15, wherein the projection has a radially inner most bottom edge which has a radius of less than 0.1 mm.

27. The lithographic apparatus of claim 15, wherein the projection has a change in surface property on an underside from liquidphobic to liquidphilic in a direction radially outwardly.

28. The lithographic apparatus of claim 15, wherein the projection has a change in surface roughness from relatively rough to relatively smooth on an underside in a direction radially outwardly.

29. The lithographic apparatus of claim 15, wherein the liquid removal device further comprises a porous material through which liquid is removed.

30. The lithographic apparatus of claim 15, wherein the projection is moveable in a plane substantially parallel to a top surface of the substrate.

31. The lithographic apparatus of claim 30, further comprising a controller adapted to control the movement of the projection in the substantially same direction relative to the projection system as the substrate is moved and at a speed equal to two times the speed of the substrate or less during at least a portion of movement of the substrate.

* * * * *